United States Patent
Ruffieux

(10) Patent No.: US 8,040,190 B2
(45) Date of Patent: Oct. 18, 2011

(54) PHASE-LOCKED LOOP

(75) Inventor: David Ruffieux, Lugnorre (CH)

(73) Assignee: CSEM Centre Suisse d'Electronique et de Microtechnique SA-Recherche et Developpement, Neuchatel (CH)

( * ) Notice: Subject to any disclaimer, the term of this patent is extended or adjusted under 35 U.S.C. 154(b) by 169 days.

(21) Appl. No.: 12/113,346

(22) Filed: May 1, 2008

(65) Prior Publication Data

US 2009/0273402 A1    Nov. 5, 2009

(51) Int. Cl.
*H03L 7/00* (2006.01)
(52) U.S. Cl. ........ 331/16; 331/116 R; 331/154; 331/158
(58) Field of Classification Search ............... 331/16, 331/107 R, 116 R, 154, 158
See application file for complete search history.

(56) References Cited

U.S. PATENT DOCUMENTS

| | | | |
|---|---|---|---|
| 6,081,164 A * | 6/2000 | Shigemori et al. | 331/16 |
| 6,172,576 B1 * | 1/2001 | Endo et al. | 331/116 R |
| 6,946,919 B2 * | 9/2005 | Knecht et al. | 331/36 C |
| 7,242,230 B2 * | 7/2007 | Boyko et al. | 327/156 |
| 2002/0149434 A1 * | 10/2002 | Toncich et al. | 331/158 |
| 2005/0122179 A1 * | 6/2005 | Ogiso | 331/107 A |
| 2008/0106342 A1 * | 5/2008 | Okamoto et al. | 331/18 |
| 2009/0115534 A1 * | 5/2009 | Imenes et al. | 331/17 |

OTHER PUBLICATIONS

Ruffieux et al., "A 2.4GHz MEMS-Based Transistor," IEEE Int'l Solid State Conf., pp. 3-4 (Feb. 2008).
Ruffieux et al., "An agile 2.4GHz MEMS-Based Digital Frequency Synthesizer," CSEM Scientific Report (May 2007).

* cited by examiner

*Primary Examiner* — Joseph Chang
*Assistant Examiner* — Jeffrey Shin
(74) *Attorney, Agent, or Firm* — Young & Thompson

(57) ABSTRACT

A phase-locked loop includes:
  a variable oscillator connected to a first resonator, said oscillator being able to deliver an output signal at a first output frequency Fout1,
  a first frequency divider receiving the output signal and able to convert it into a divided frequency signal Fout1/n,
  a reference oscillator connected to a second so-called reference resonator, delivering a reference signal at a low reference frequency Fref, generating an electrical dissipation lower than a microampere,
  a phase comparator measuring the phase error between the divided frequency signal Fout1/n and the reference signal and being able to produce a test signal,
  a low-pass filter or an integrating circuit able to filter the test signal and able to generate a voltage or a control word designed to control the voltage-controlled or digitally controlled oscillator.

12 Claims, 6 Drawing Sheets

PHASE-LOCKED LOOP

TECHNICAL FIELD

The present invention concerns phase-locked loops, commonly called PLL.

It more particularly concerns phase-locked loops used as frequency synthesizers in transceivers for radiofrequency transmission applications.

PRIOR ART

FIG. 1 shows a classic PLL 10 architecture able to generate a Fout1 output frequency which depends on a given reference frequency Fref. This type of architecture is typically integrated into a frequency synthesizer. The PLL 10 comprises a voltage controlled oscillator (VCO) 11, able to deliver an output signal at the output frequency Fout1, and a frequency divider 12 to convert the output signal addressed in a divided frequency signal Fout1/n by applying a division ratio n.

The VCO 11 is conventionally connected to a first resonator 7 of the LC type well known by those skilled in the art. The divided frequency signal coming from the frequency divider 12 is addressed to a first inlet of a phase comparator 13 which also receives, on a second inlet, a reference signal at the frequency Fref coming from a crystal oscillator 14, for example, connected to a second resonator 8, generally of the quartz type. The phase comparator 13 is able to produce an error signal corresponding to the phase difference between the divided frequency signal and the reference signal. The PLL also comprises a low-pass filter or an integrating circuit 15 driven by the error signal and the output of which is a voltage able to control the VCO 11.

It must be noted that a charge pump can be associated with the low-pass filter 15. The charge pump is able to produce a load current proportional to the phase error signal on an input node of the low-pass filter 15

The setting applied on the divider 12 is adapted such that:

$$Fout1 = n \times Fref$$

One thus obtains an output frequency Fout1 directly proportional to the reference frequency.

The reference frequency Fref, traditionally generated by the quartz oscillator 14 connected to the second quartz resonator 8, can vary from several kilohertz to several tens of megahertz. Its production requires a quartz crystal sized according to the desired resonance frequency. Commonly, one uses a radio-type quartz resonator of several tens of megahertz, making it possible to generate a more precise output frequency. The use of this type of quartz resonator makes it possible, for example, to respect the GSM standard which requires a frequency in the vicinity of 900 MHz or 1800 MHz according to the given European standards.

In the framework of cell- or battery-powered radiofrequency applications, in which low consumption is a priority, one can turn on the frequency synthesizer and a radio periodically. To do this, one uses a time base to maintain a real-time clock (RTC).

One could also use the second quartz radio resonator to generate both a time base and a frequency reference. However, the device thus obtained would present much too significant a consumption. Indeed, to provide a time base, the quartz radio resonator drives a higher consumption due to its high operating frequency and the need always to be active. The autonomy of the electronic device using this type of synthesizer would therefore be very limited, which is crippling for a large number of applications. To resolve this problem, a third external resonator must be used to generate the time base. Traditionally, a clock-type quartz resonator is satisfactory.

One could also think to use this third resonator to supply the frequency Fref. However, in this type of configuration, the noise of the output signal of the PLL is very severely degraded. This is even worst if one wishes to obtain a significant output frequency.

In a PLL from the prior art, enabling production of a high output frequency Fout, all while having a limited consumption, one therefore has three resonators: the resonator 7 integrated into the voltage-controlled oscillator 11, the second quartz resonator 8 of the radio type, and the third external resonator of the clock type.

However, in a desire to miniaturize electronic devices and integrate a large number of components into a same case, it is not very interesting to have to use three resonators. Moreover, the need to use three resonators implies relatively high production costs, in particular due to the external resonators.

Moreover, the association of the LC-type resonator with the quartz radio resonator calls for a large bandwidth of the PLL to eliminate the close-in phase noise of the LC oscillator, limited by the low quality factor of the coil (10 for an integrated induction coil), which would degrade the achievable spectral purity otherwise.

DISCLOSURE OF THE INVENTION

One object of the present invention is to provide a phase-locked loop able to generate a radiofrequency having good spectral purity despite the use of a real-time clock with weak dissipation.

Another object of the invention is to provide a phase-locked loop with an optimal degree of integration needed for portable applications, both in terms of improving performance and cost reduction.

Another object of the invention is to provide a phase-locked loop making it possible to program the desired frequency by using a low-frequency reference, and with limited consumption.

More particularly, the invention concerns a phase-locked loop comprising:
  a variable oscillator connected to a first resonator, said oscillator being able to deliver an output signal at a first output frequency Fout1,
  a first frequency divider receiving said output signal and able to convert it into a divided frequency signal Fout1/n,
  a reference oscillator connected to a second so-called reference resonator, delivering a reference signal at a reference frequency Fref,
  a phase comparator able to produce a signal for measuring a phase deviation between the divided frequency signal and the reference signal.
  a low-pass filter or an integrating circuit able to filter the test signal and able to generate a voltage or a digital word designed to control the voltage or digitally-controlled oscillator.

According to the invention, the first resonator is an acoustic wave piezoelectric resonator and the second reference resonator is arranged so as to generate a time base designed to trigger generation of the output signal Fout1 at defined intervals.

According to one advantageous embodiment of the invention, in which the second resonator is of the silicon type, its reference frequency is able to be temperature compensated by electronic means.

BRIEF DESCRIPTION OF THE DRAWINGS

Other characteristics of the present invention will appear more clearly upon reading the following description, done in reference to the appended drawings, in which.

EMBODIMENT(S) OF THE INVENTION

Figure 1:
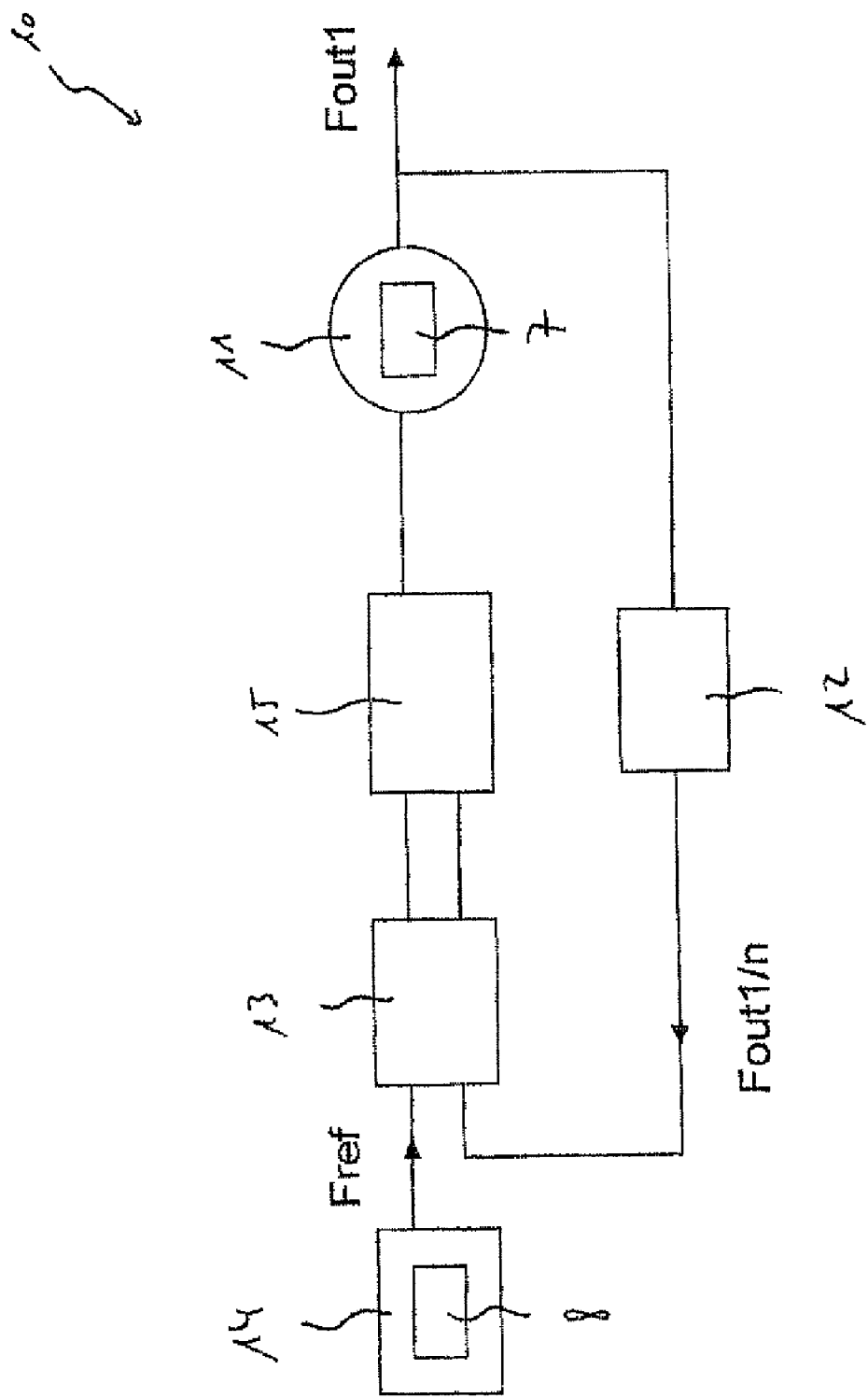
FIG. 1, previously described, illustrates a phase-locked loop of the prior art.
Figure 2:
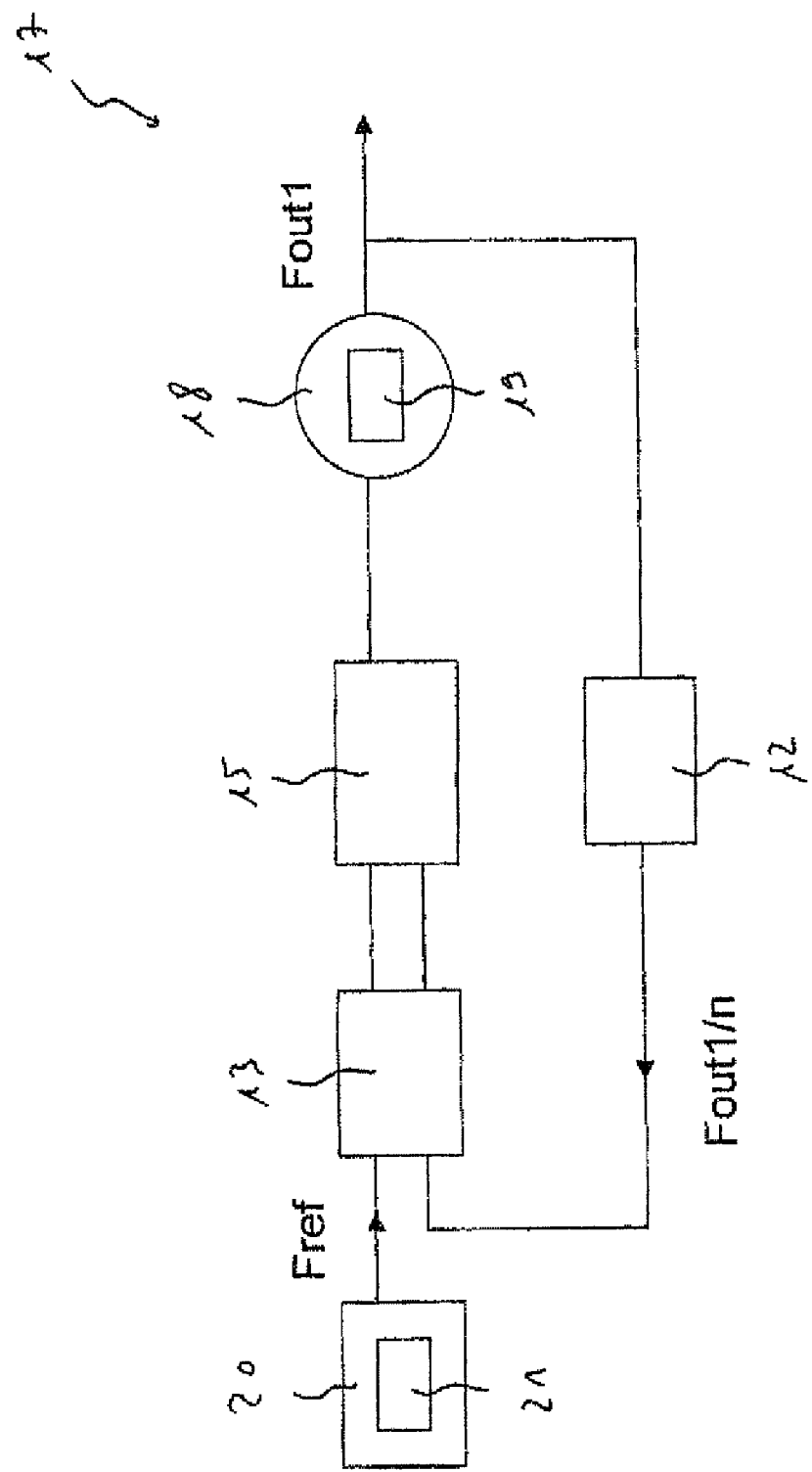
FIG. 2 illustrates a first embodiment of a phase-locked loop according to the present invention.

A phase-locked loop 17 shown in FIG. 2 comprises a voltage-controlled oscillator 18 connected to a first acoustic wave piezoelectric resonator 19 which will be described in detail below. The oscillator 18 is also connected to a frequency divider 12. Furthermore, the loop 17 comprises a phase comparator 13 having two inlets, the first being connected to the divider 12 and the second to a reference oscillator 20 connected to a second resonator 21. According to a first important aspect of the invention, the second resonator 21 supplying the reference frequency is a low-frequency resonator, its frequency being between 10 kHz and 2 MHz, and preferably between 30 kHz and 1 MHz. The comparator 13 is connected to a filter 15 which itself is connected to the oscillator 18. The operating mode of the loop 17 for generation of the output frequency Fout is comparable to that presented in the description of FIG. 1.

According to a second important aspect of the invention, the reference oscillator 20 connected to the second low-frequency resonator 21 is used to generate a time base. Its low frequency and its high quality factor (greater than 50000) make it possible to obtain electrical dissipation lower than a microampere. Consumption is therefore very low when only the time base is active.

The second resonator can be a clock-type quartz resonator having a frequency of 32 kHz. It is also possible to obtain the time base by integrating a low-frequency silicon-type resonator, which is very attractive in terms of miniaturization. Indeed, integration on the bulk substrate in a semi-conductor material such as silicon is made possible thanks to the methods existing in the semi-conductor industry. Part of the production of this type of resonator consists of arranging a layer of piezoelectric material between two metallic electrodes. It is in particular advantageous to use aluminum nitride (AlN) as the piezoelectric material since CMOS co-integration is possible. To enable better insulation of the device, it is done on an air cavity implemented in the substrate itself.

Moreover, one will note that, thanks to the fact that the first piezoelectric resonator 19 connected to the local oscillator is of the acoustic wave type having then a very high Q-factor, one obtains a radiofrequency carrier having a good signal over noise ratio, in comparison with that obtained for a device of the prior art from the same reference oscillator 20. Indeed, the resonator 19 has a high quality factor, typically between 300 and 1000 to be compared with 10 for an LC resonator. Knowing that the gain is proportional to the square of the ratio of quality factors, one therefore obtains a very large gain in terms of phase noise while also having a consumption of the PLL 17 comparable to a PLL of the prior art. The noise of the oscillator 18 close to the radiofrequency carrier no longer limits the signal over noise ratio during transmission of a signal. Advantageously, it is possible to use only a narrow operating bandwidth for the PLL 17 to eliminate the noise from the reference which, related to Fout1, is amplified by the square of the Fout1/Fref ratio, which therefore becomes very large relative to the state of the art, as Fref is much lower than the Fref of the prior art (16 MHz). The bandwidth of the PLL 17 must simply be sufficient to compensate for the temperature deviation and the aging of the first acoustic wave resonator 19. A bandwidth value for the filter 15 between 0.01 Hz and 100 kHz and preferably between 0.1 Hz and 100 Hz is perfectly suitable. The bandwidth will be chosen according to the thermal time constant of the system or the embodiment.

Two types of acoustic wave resonators 19 may be considered: resonators of the SAW (Surface Acoustic Wave) type and resonators of the BAW (Bulk Acoustic Wave) type. The surface acoustic wave resonator of the SAW type is made up of metallic electrodes in the form of a comb with interlacing fingers. These electrodes are deposited on a piezoelectric material. The mode of operation is as follows: the entering electrical waves are transformed into acoustic waves via the electrode. When exiting, the opposite transformation takes place. In the meantime, the waves are guided along the surface of the piezoelectric material. For applications using frequencies higher than 2 GHz, it becomes interesting to integrate BAW-type resonators. Indeed, the interval between the fingers of the electrodes of the SAW decreasing, photolithography and etching methods do not have a resolution sufficient to produce them. In BAW-type resonators, the sound wave spreads freely in volume as in an infinite environment. They are therefore not confronted with limitations due to the manufacturing methods. Moreover, one can note that BAW-type resonators consume a smaller surface of the semi-conductor substrate.

A first type of BAW-type sound element is known by the name "Surface Mounted Resonator" (SMR). It provides for arranging the resonant part formed by a layer of piezoelectric material sandwiched between two metallic electrodes on a reflective element such as a Bragg mirror. For information, this mirror can be made on the silicon substrate by a pile of insulating layers having different impedances. Alternatively, a second type of BAW-type sound element may be the "Film Bulk Acoustic Resonator" (FBAR) type. The resonant part is arranged above an air cavity. The Bragg mirror or the cavity thus ensures good insulation and avoids damping of the sound waves.

If the PLL 17 is provided with the local oscillator 18 connected to a BAW-type resonator and the reference oscillator 20 connected to a silicon-type resonator, one may provide for a particular implementation of the invention by co-integrating both resonators on a same semi-conductor substrate and connecting a circuit integrated to the two resonators using a "flip-chip" method well known in the microelectronics industry. The compactness of the device is then guaranteed since, typically, the following dimensions can be considered for the structure: 1.4 mm×2 mm×0.4 mm.

Another embodiment of the invention may provide for placing a delta sigma modulator between the output of the reference oscillator 20 and the inlet of the frequency divider 12. Fractional divisions will be able to be done with the goal of increasing the precision for determining the output frequency Fout1.

Figure 3:
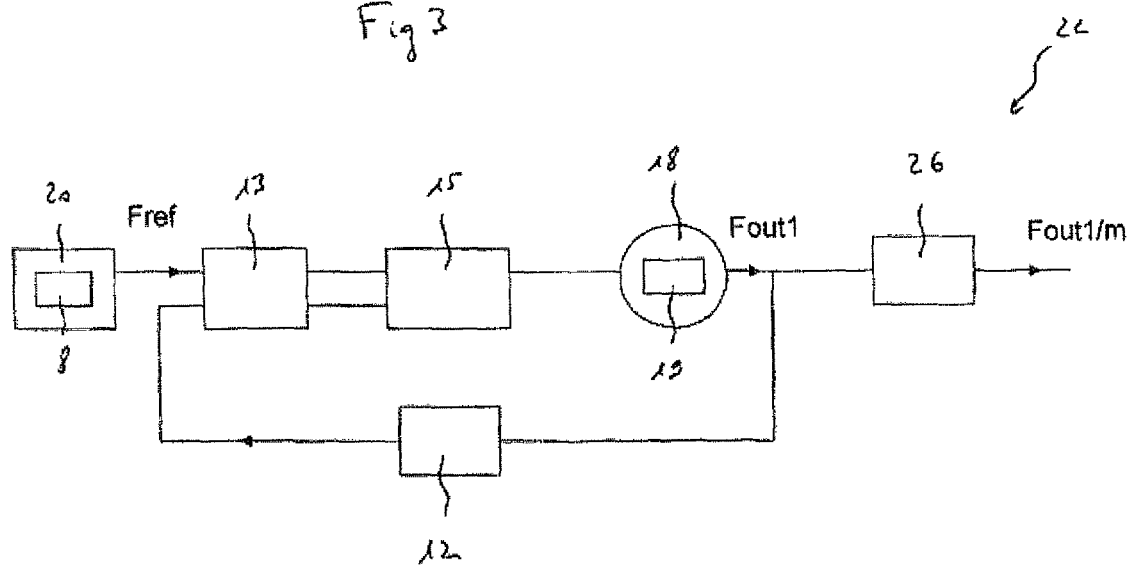
FIG. 3 illustrates a second embodiment of the phase-locked loop according to the invention.

FIG. 3 illustrates a phase-locked loop 22 according to one particular implementation of the present invention. Similarly to the PLL 17 previously described, the loop 22 comprises the oscillator 18, the divider 12, the comparator 13, the filter 15 and the reference oscillator 20 connected to the second quartz resonator 8. The PLL 22 also comprises a frequency divider 26 dividing by m and connected to the output of the oscillator 18. The divider 26 can be a programmable integer divider. For example, it is possible to synthesize a radiofrequency frequency Fout1 of exactly 2.4 GHz due to the use of the first BAW-type resonator 19. Through integer frequency divisions using the divider 26, it is possible to program the generation of the following Fout1/m frequencies: 240 MHz, 200 MHz, 160 MHz, 150 MHz, 120 MHz, etc.

The divider 26 can also be arranged as a fractional divider (resulting of the combination of an integer divider with a delta sigma modulator). One can then combine Fout1 and Fout1/m with the help of a mixer, Fout1/m being able to vary extremely quickly. This can be used very advantageously in the framework of a frequency-hopping reception system (Bluetooth type) or to produce a modulated transmission signal. It is therefore possible to generate a frequency value Fout1/m exact to 6 or 7 significant digits.

In a practical implementation, the divider 26 can be formed by two fractional dividers in parallel, one of them enabling to modulate and to choose a channel by using a mixer and the other providing the system with a rapid clock for modulation and demodulation.

Figure 4:
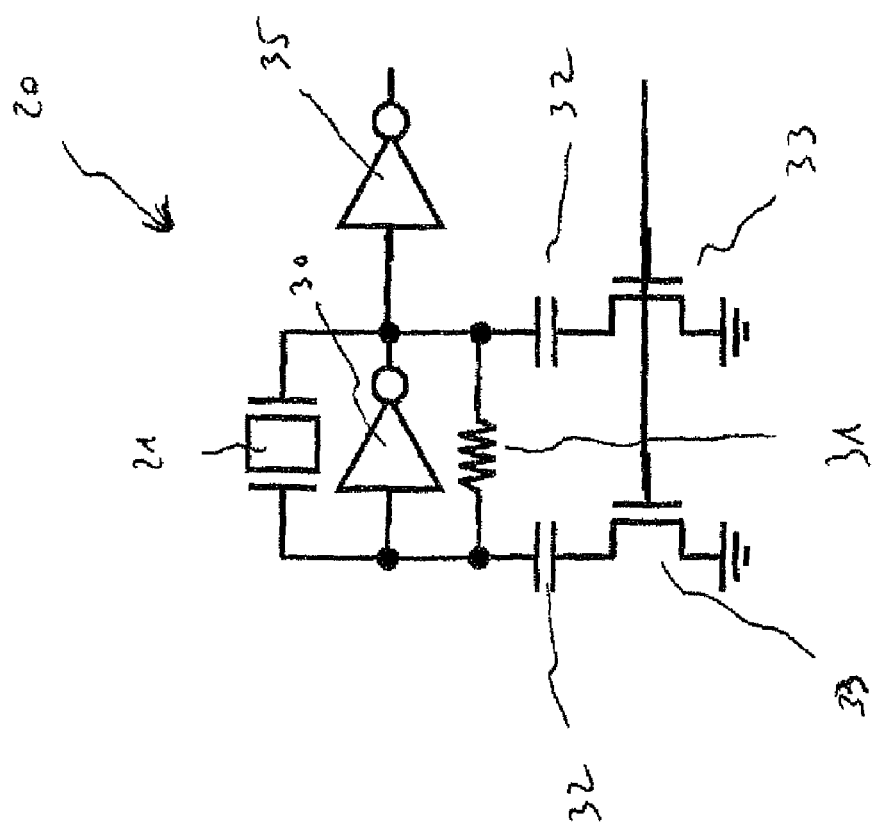
FIG. 4 illustrates an oscillator structure traditionally used in connection with a resonator.

FIG. 4 shows an example of an oscillator 20 connected to the second silicon-type low-frequency piezoelectric resonator 21. The reference oscillator 20 comprises a first inverter 30 placed between the resonator nodes 21 and a bias resistor 31 connected to the terminals of the oscillator 20. In the framework of a bi-frequency mode, the oscillator is connected to a bank of one or two switchable capacitors 32: each of the two capacitors 32 is connected to the mass by a switch which can be a MOS-type transistor 33. If the oscillator 20 is used as a time base output to keep a real-time clock, a second inverter 35 identical to the first inverter 30 is connected to said oscillator 20.

The frequency of oscillation of the oscillator 20 can be made variable by adjusting the load capacity using switchable capacitors 32. In bi-frequency mode, one talks about the difference of pulling. The difference in frequency between the resonance frequency and the oscillation frequency of the resonator 21 corresponds to this pulling. For example, the oscillation frequency depending (inversely proportionately) on the load capacity, the pulling is therefore null for an infinite load capacity. One therefore understands that by acting on these load capacities, it is possible to modify the oscillation frequency so as to compensate for a possible thermal drift.

However, a so-called bi-frequency mode device only allows compensation for variations of the frequency of the resonator according to the temperature on a scale corresponding to the so-called difference of pulling between the high frequency and the low frequency. The frequency variation of a silicon resonator, depending on the temperature, is close to −30 parts per million (ppm) per degree Celcius. It has been shown that one could obtain a pulling in the vicinity of 100 ppm for a resonator of this type. The silicon-type resonator therefore can only be compensated over a range of approximately 3 degrees Celsius, which is insufficient for an industrial application.

To obtain a stable temperature reference for a timekeeping application, it is possible to use a compensation device provided with a silicon-type resonator, even though this type of resonator is generally qualified as fairly imprecise, in the sense that it has a large manufacturing limit and significant thermal drift.

Figure 5:
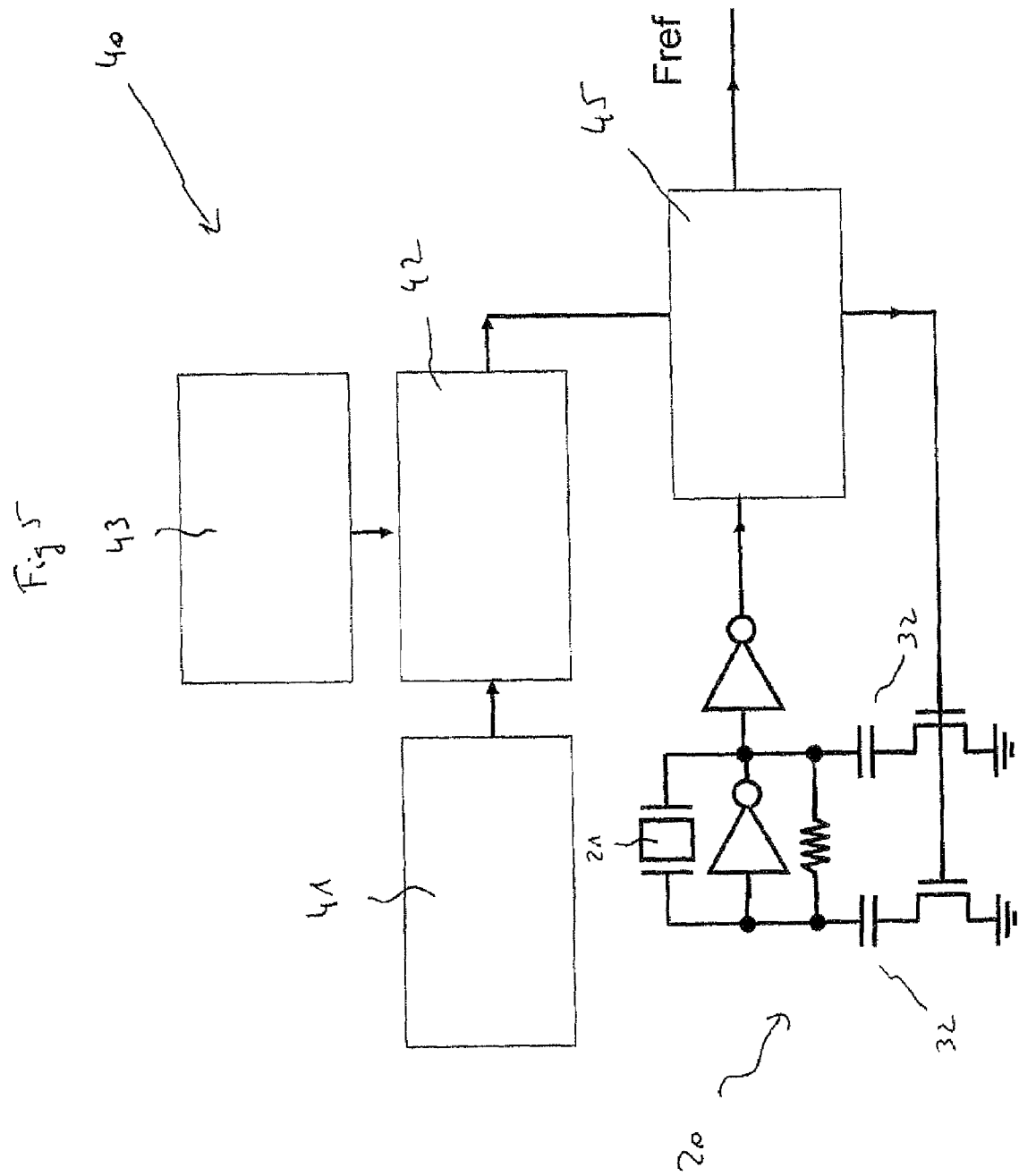
FIG. 5 illustrates part of a third embodiment of the present invention.

The device 40, shown in FIG. 5, is able to compensate the temperature drift of a reference frequency of the silicon-type low-frequency piezoelectric resonator 21. It comprises a temperature sensor 41 connected to a sequencer 42 which can be a state machine or a microcontroller. The temperature sensor 41 can be a transducer able to convert one form of energy into another form which can preferably be an electrical measure. A memory 43, directly connected to the sequencer 42, makes it possible to store calibration data. The sequencer 42 is directly connected to a variable counter 45 which controls the switchable capacitors 32 described in FIG. 4. The variable counter 45 is typically a variable frequency divider, i.e. the value used, for example a positive integer number N, to divide a given frequency, can be parameterized.

The temperature sensor 41 measures an operating temperature of the circuit at defined intervals and provides a first signal corresponding to the measured temperature. The sequencer 42 determines a second compensated signal integrating the value of the temperature, from the first signal using calibration data, the second signal representing the value N. Likewise, the sequencer 42 delivers a third signal representing a ratio between a positive integer number S and the integer number N, S being less than or equal to N. This ratio corresponds to an activity ratio. The parameters of the variable counter 45 are set by the second and the third signals. The counter 45 generates a fourth output signal, every N periods of a clock signal coming from the resonator 21. This counter 45 plays the role of a frequency divider which produces a cycle every N periods of signal received in input. The fourth signal corresponds to the compensated reference frequency signal. Moreover, the counter 45 has an additional function, namely detecting the state S. The counter thus produces a fifth signal able to modify the load capacity of the oscillator 20 to produce a high- or low-frequency signal. This fifth signal produces a value which changes according to the veracity of the inequality formed by the state S less than or equal to the state N. The activity ratio can thus be adjusted. This activity ratio corresponds to the average time that the oscillator 20 spends in low frequency during N cycles of the oscillator signal.

The frequency variations of the silicon-type resonator 21 according to the temperature can be the object of an approximation by a linear-type function, with the understanding that the function can also be larger. The parameters of this function can be stored in the memory 43. The function can be calculated by the sequencer 42 according to the first signal.

The sequence 42 also puts the temperature sensor 41 into operation at defined intervals. The value of the temperature can, as an example, correspond to an electric voltage value, itself converted into a digital format using an analog digital converter. With the help of the calibration data, the sequencer 42 will therefore calculate a register value which is applied on the variable counter 45 with the goal of changing the number of cycles to deduct according to the temperature value measured by the sensor. One typically uses a 16-bit register. It should be noted that the number of cycles to be deducted changes only when the activity ratio exits the interval between 0 and 1.

Figure 6:
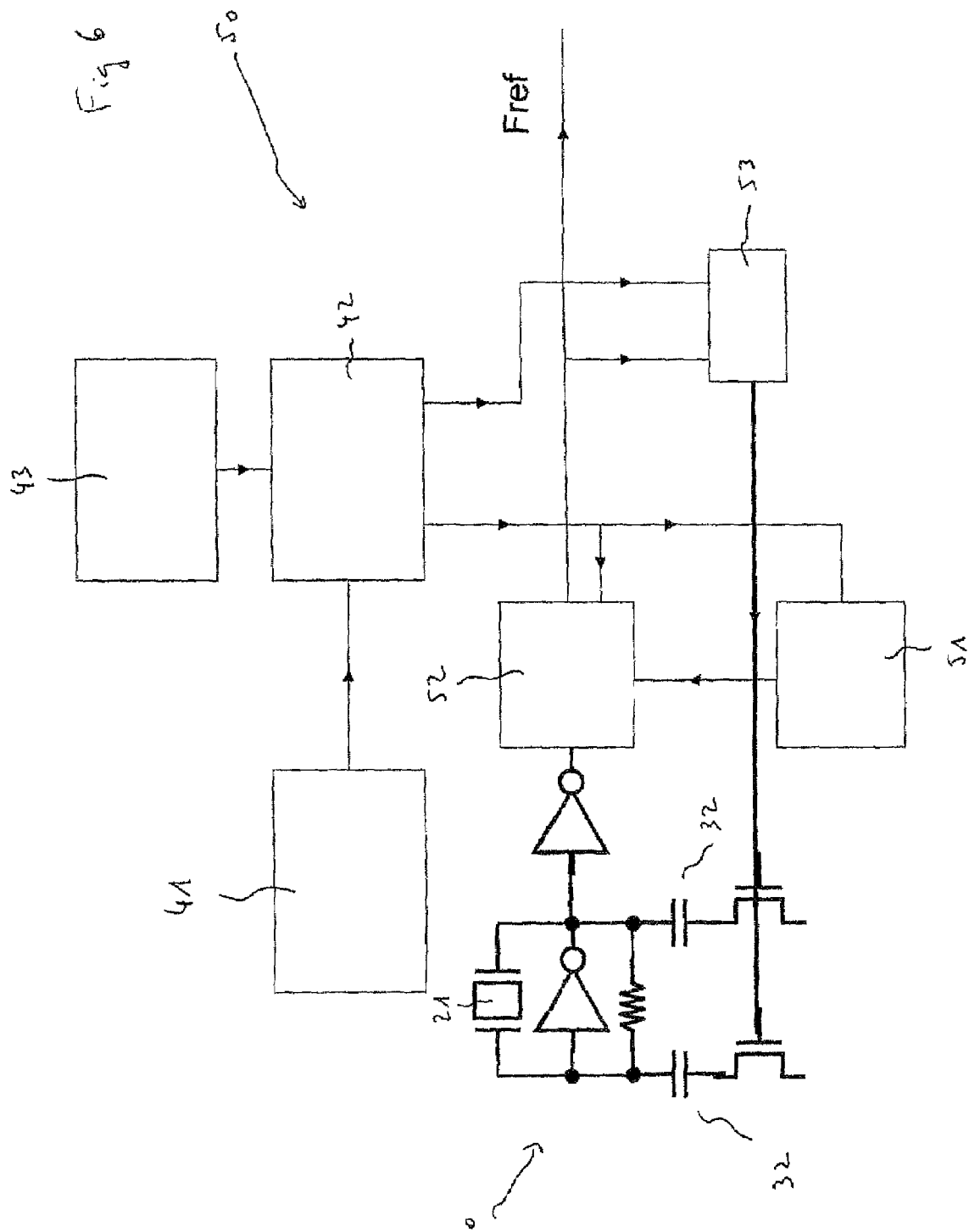
FIG. 6 illustrates part of a fourth embodiment of the present invention.

FIG. 6 provides a fourth embodiment of a temperature compensation device of a frequency of a silicon-type resonator. Unlike the third embodiment shown in FIG. 5 and in which the compensated frequency is generated directly by integer division, the second implementation makes it possible to generate, via a device 50, a power of two multiplied by the compensated frequency, the latter being now virtually implemented.

Comparably to the device 40, this device 50 comprises the temperature sensor 41 connected to the sequencer 42, and the memory 43 with the same function as previously.

The sequencer 42 is connected to an accumulator 51 and a bi-module counter 52. The two elements 51 and 52 are connected to each other. The sequencer 42 is also connected to a counting element, which can in particular be a fixed counter or an accumulator of the first order or a higher order. According to the example, the counting element is a fixed counter 53 dividing by M, whereof one of the output signals defined below drives the switched capacitors 32 of the oscillator 20.

Like the device 40, the sequencer 42 determines the second signal representing the value N which, in the case of the device 40, is not integer but comprises a fractional part Nfrac. A sixth signal corresponding to the fractional part Nfrac of N drives the accumulator 51 and a seventh signal corresponding to the integer part Nint of N drives the bi-module counter 52. When it is full (carry output or retained=1), the accumulator switches the bi-module counter to its higher value (Nint+1) without, however, memorizing (accumulating) this control bit. The accumulator 51 is typically a limited discrete integrating circuit.

As in the third embodiment, the sequencer delivers the third signal representing the ratio between S and M, S being less than or equal to M, M being the fixed division rate of counter 53. The fixed counter 53 is driven by the third signal. The bi-module counter 52 generates the fourth output signal every Nint or Nint+1 periods of the clock signal coming from the resonator 21, this signal corresponding to the compensated reference frequency signal Fref defined above according to the outline of FIG. 5, multiplied by $2^i$, i being the number of bits of Nfrac. The result is that the average signal frequency obtained over a period Fref is strictly equal to Fref. Moreover, the counter 53 has an additional function, namely that of detecting the lower state S of the fixed value of the counter M. One of the output signals mentioned above is, as in the first embodiment, the fifth signal able to modify the load capacity of the oscillator 10 to produce a high- or low-frequency signal. This type of counter is typically a frequency divider, which divides the value of the frequency of an input signal by a fixed predetermined value. This fifth signal produces a value which changes according to the veracity of the inequality defined by the state S less than or equal to the state fixed by the counter 53. The activity ratio between the high frequency and the low frequency defined by the ratio between S and M is thus controlled thanks to this counter 53.

As a numerical example, the third embodiment can generate a frequency of 32 Hz from the silicon-type 1 MHz resonator 21. This frequency being very specific, it is advantageous to use the fourth implementation making it possible to precisely generate the frequency of a quartz resonator, i.e. 32768 Hz. Indeed, given that the exact frequency of a quartz resonator is directly equal to $2^{10}$ times 32 Hz, the division value of the counter 53 can be fixed at 1024, i.e. $2^{10}$.

The proposed solution is therefore compatible will all types of devices typically comprising a quartz clock.

Of course, the present invention is open to various variations and modifications which will appear to those skilled in the art. In particular, one can use a variable oscillator other than the VCO above. Particularly, if one wishes to obtain a completely digital PLL, a digitally-controlled oscillator (DCO) can be combined with a digital filter, replacing the analog filter of the RC-type. Thus, the time to wake the phase-locked loop will be shorter thanks to memorization. Moreover, it must be noted that other types of oscillators can be connected to a silicon-type piezoelectric resonator. As a non-limiting example, one can cite document EP 1 265 352 in the applicant's name, in which is disclosed a differential oscillator which can be used in the invention as defined in the present application. Moreover, a bi-frequency mode was presented in the description. The invention would also work for a multi-frequency oscillator.

What is claimed is:

1. A phase-locked loop device, comprising:
    a variable oscillator connected to a first resonator, said oscillator being able to deliver an output signal at a first output frequency Fout1,
    a first frequency divider receiving said output signal and able to convert it into a divided frequency signal Fout1/n,
    a frequency reference generator connected to a second reference resonator, delivering a reference signal at a low reference frequency Fref, said second reference resonator simultaneously implements both a real time clock signal, with which to generate a time base having an electrical dissipation lower than a microampere, and said frequency reference generator to generate the first output frequency Fout1 having a signal over noise ratio for a radio frequency carrier,
    a phase comparator measuring the phase error between the divided frequency signal Fout1/n and the reference signal and being able to produce a test signal,
    a low-pass filter or an integrating circuit able to filter the test signal and able to generate a voltage or a control word designed to control the voltage-controlled or digitally controlled variable oscillator,
    wherein said reference frequency Fref is between 10 kHz and 2 MHz, said first resonator is an acoustic wave piezoelectric resonator, and
    the low-pass filter is provided with a bandwidth lower than 100 Hz.

2. The phase-locked loop device of claim 1, in which said second reference resonator (8, 21) is a quartz resonator.

3. The phase-locked loop device of claim 2, in which said loop also comprises second frequency divider able to receive the output signal at the first output frequency Fout1 and to convert it into a divided frequency signal Fout1/m.

4. The phase-locked loop device according to claim 3, in which said second frequency divider (26) is of the integer type and is able to generate frequency values of 240 MHz, 200 MHz, 160 MHz, 150 MHz, 120 MHz, etc.

5. The phase-locked loop device according to claim 3, in which said second frequency divider (26) is of the fractional type and is able to generate any frequency value.

6. The phase-locked loop device according to claim 3, in which said second frequency divider (26) is formed by two dividers in parallel.

7. The phase-locked loop device of claim 1, in which said second reference resonator (21) is a silicon-type resonator.

8. The phase-locked loop device of claim 7, in which said first resonator is of the BAW type and in which said first resonator and said second resonator are produced on a same substrate in a semi-conductor material.

9. The phase-locked loop device of claim 7, in which the reference frequency of said silicon-type resonator is able to be compensated in temperature by electronic means.

10. The phase-locked loop device of claim 1, in which said first resonator is of the Bulk Acoustic Wave type.

11. The phase-locked loop device of claim 1, in which said first resonator is of the Surface Acoustic Wave type.

12. The phase-locked loop device of claim 1, wherein said reference frequency Fref is between 30 kHz and 1 MHz.

* * * * *